(12) United States Patent
Kang et al.

(10) Patent No.: US 8,185,332 B2
(45) Date of Patent: *May 22, 2012

(54) APPARATUS AND METHOD FOR ESTIMATING RESISTANCE CHARACTERISTICS OF BATTERY BASED ON OPEN CIRCUIT VOLTAGE ESTIMATED BY BATTERY VOLTAGE VARIATION PATTERN

(75) Inventors: Jung-Soo Kang, Daejeon (KR); Ju-Young Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/172,922

(22) Filed: Jun. 30, 2011

(65) Prior Publication Data
US 2011/0256434 A1 Oct. 20, 2011

Related U.S. Application Data

(63) Continuation of application No. 12/484,434, filed on Jun. 15, 2009, now Pat. No. 7,996,167.

(30) Foreign Application Priority Data

Aug. 14, 2008 (KR) .................. 10-2008-0080122

(51) Int. Cl.
*G01R 27/00* (2006.01)
(52) U.S. Cl. ........................................... 702/65
(58) Field of Classification Search .............. 702/57, 702/60, 63–65, 99, 173, 179, 182, 183, 188, 702/189; 320/124, 127, 166
See application file for complete search history.

(56) References Cited

U.S. PATENT DOCUMENTS

| | | | |
|---|---|---|---|
| 6,832,171 B2 | 12/2004 | Barsoukov et al. | |
| 7,612,532 B2 * | 11/2009 | Verbrugge | 320/132 |
| 7,996,167 B2 * | 8/2011 | Kang et al. | 702/65 |
| 2006/0176022 A1 | 8/2006 | Namba | |
| 2010/0036626 A1 | 2/2010 | Kang et al. | |

FOREIGN PATENT DOCUMENTS

| | | |
|---|---|---|
| JP | 2002-189066 A | 7/2002 |
| JP | 2006-215001 A | 8/2006 |
| JP | 2007-24673 A | 2/2007 |

* cited by examiner

*Primary Examiner* — Mohamed Charioui
(74) *Attorney, Agent, or Firm* — Birch, Stewart, Kolasch & Birch, LLP

(57) ABSTRACT

An apparatus for estimating resistance characteristics of a battery includes a data storing manager for obtaining and storing battery voltage, current and temperature data of a battery, whenever estimating a battery resistance characteristic; an open circuit voltage calculator for calculating battery open circuit voltage from a battery voltage variation pattern measured at the present and in the past; a weighted mean resistance calculator for calculating a battery resistance parameter from a battery current and a difference between the battery open circuit voltage and a battery voltage, and calculating a weighted mean resistance from battery resistance parameters calculated at the present and in the past; a weighted mean resistance convergence calculator for calculating a weighed mean resistance convergence value by repeatedly calculating a weighted mean sequence using the weighted mean resistance as an initial condition; and a resistance characteristic estimator for estimating a battery resistance from the weighted mean resistance convergence value.

31 Claims, 7 Drawing Sheets

FIG. 8

| CHANNEL | ACTUAL RESISTANCE(mΩ) | ESTIMATED RESISTANCE(mΩ) | ERROR OF ESTIMATED RESISTANCE |
|---|---|---|---|
| 1 | 7.0 | 7.3 | 0.3 |
| 2 | 4.9 | 5.0 | 0.1 |
| 3 | 4.8 | 4.9 | 0.1 |
| 4 | 3.4 | 3.5 | 0.1 |
| 5 | 3.5 | 3.5 | 0.0 |
| 6 | 3.4 | 3.5 | 0.1 |
| 7 | 3.7 | 3.7 | 0.0 |
| 8 | 3.7 | 3.7 | 0.0 |
| 9 | 3.7 | 3.7 | 0.0 |
| 10 | 4.5 | 4.6 | 0.1 |
| 11 | 4.5 | 4.6 | 0.1 |
| 12 | 4.5 | 4.6 | 0.1 |

APPARATUS AND METHOD FOR ESTIMATING RESISTANCE CHARACTERISTICS OF BATTERY BASED ON OPEN CIRCUIT VOLTAGE ESTIMATED BY BATTERY VOLTAGE VARIATION PATTERN

This application is a Continuation of U.S. application No. 12/484,434 filed Jun. 15, 2009, now U.S. Pat. No. 7,996,167 and claims the benefit of priority of KR-10-2008-0080122, filed Aug. 14, 2008. The entire content of each of the above-identified applications is hereby incorporated by reference.

BACKGROUND OF THE INVENTION

1. Field of the Invention

The present invention relates to apparatus and method for estimating resistance characteristics of a battery, and more particularly to apparatus and method for estimating resistance characteristics of a battery based on an open circuit voltage of the battery.

2. Description of the Related Art

In recent, as air pollution becomes worse and fossil fuels are exhausted, electric vehicles such as hybrid vehicles, which may be operated using a battery, are highlighted. A capacity of the battery is slowly decreased as it is used. It is because the electrochemical reaction of the battery is irreversible. A battery used in a portable device such as a cellular phone does not cause serious problems though its capacity is decreased. However, if a capacity of a battery used in an electric vehicle is lowered below an allowable limit, the vehicle may be stopped abruptly due to the shortage of a battery capacity. In addition, if the battery is repeatedly overcharged or overdischarged in a state that the battery capacity is lowered below an allowable limit, serious problems in stability of the battery such as explosion may happen.

Accordingly, in the battery-related industries, the research for quantitatively evaluating the aging effect according to the use of battery is actively performed. To quantitatively evaluate the aging effect of a battery, electrochemical parameters whose properties are changed according to a using time of the battery are needed, and a battery resistance may be considered as one of such parameters. The battery resistance tends to increase according to a using time of the battery, so the aging effect of a battery may be quantitatively evaluated by measuring a resistance of the battery and then comparing it with an initial resistance value when the battery was produced.

However, the battery resistance cannot be directly measured while the battery is charged or discharged. Thus, in the related art, a voltage of a battery and a charging/discharging current were measured, and then a battery resistance was indirectly measured according to the Ohm's law. However, the battery voltage shows deviation from an actual voltage due to the IR drop effect, and the battery current also has a measurement error, so the resistance simply calculated according to the Ohm's law has an error in comparison to an actual resistance.

For reference, the IR drop effect means a phenomenon that a voltage is rapidly changed when a battery starts being discharged in connected to a load or starts being charged from an external power source. In other words, a battery voltage rapidly decreases when discharging is initiated, and a voltage rapidly increases when charging is initiated.

Thus, there are active researches on methods capable of measuring a battery resistance more accurately in the related art.

SUMMARY OF THE INVENTION

The present invention is designed to solve the problems of the prior art, and therefore it is an object of the present invention to provide apparatus and method for estimating battery resistance characteristics with high accuracy.

In order to accomplish the above object, the present invention provides an apparatus for estimating resistance characteristics of a battery based on a battery voltage variation pattern, which includes a data storing manager for obtaining and storing battery voltage, current and temperature data from a voltage sensor, a current sensor and a temperature sensor, which are coupled to a battery, whenever a resistance characteristic is estimated; an open circuit voltage calculator for calculating a battery open circuit voltage from a battery voltage variation pattern measured at the present and in the past; a weighted mean resistance calculator for calculating a battery resistance parameter from a battery current and a difference between the battery open circuit voltage and a battery voltage, and calculating a weighted mean resistance from battery resistance parameters calculated at the present and in the past; a weighted mean resistance convergence calculator for calculating a weighed mean resistance convergence value by repeatedly calculating a weighted mean sequence using the weighted mean resistance as an initial condition; and a resistance characteristic estimator for estimating a battery resistance from the weighted mean resistance convergence value.

In one aspect, the resistance characteristic estimator may estimate the weighted mean resistance convergence value as a battery resistance.

In another aspect, the resistance characteristic estimator may estimate a battery resistance by mapping a battery resistance corresponding to the calculated weighted mean resistance convergence value from a look-up table defining a battery resistance for each weighted mean resistance convergence value.

In still another aspect, the resistance characteristic estimator may estimate a battery resistance by inputting the calculated weighted mean resistance convergence value to a function using the weighted mean resistance convergence value and the battery resistance as an input parameter and an output parameter, respectively.

In further another aspect, the resistance characteristic estimator may estimate a battery resistance by relatively comparing the calculated weighted mean resistance convergence value with a weighted mean resistance convergence value corresponding to an initial battery resistance value when a battery was produced.

Preferably, the resistance characteristic estimator may estimate a relative ratio of the estimated battery resistance to an initial battery resistance value based on an allowable maximum resistance as a parameter representing battery resistance degradation.

In the present invention, the open circuit voltage calculator may include an open circuit voltage variation calculating unit for calculating an open circuit voltage variation from a variation pattern of the stored battery voltages measured at the present and in the past by applying a mathematic model defining a correlation between a battery voltage variation pattern and an open circuit voltage variation, and estimating an open circuit voltage variation at a present stage by reflecting a correction factor corresponding to battery temperature on the calculated open circuit voltage variation; and an open circuit voltage estimating unit for estimating a battery open circuit voltage at the present stage by reflecting the estimated open circuit voltage variation to a battery open circuit voltage estimated at a last stage.

Preferably, the open circuit voltage estimating unit may correct an open circuit voltage by adding a difference between a weight mean value (a greater weight is endowed as battery voltage is measured earlier) for present and previous battery voltages and an open-circuit voltage at a last stage to the estimated open-circuit voltage at a present stage. In this case, the previous battery voltage may be a battery voltage at a last stage.

Preferably, the estimated open circuit voltage variation may be calculated by multiplying the calculated open circuit voltage variation by the correction factor corresponding to temperature.

According to the present invention, the battery voltage variation pattern may include at least voltages $V_n$, $V_{n-1}$ and $V_{n-2}$ measured at a present stage, at a last stage and at the stage before last.

Preferably, the mathematical model may be defined by a mathematical operation between a battery voltage variation between a present stage and a previous stage and a pattern function defined by each voltage of the battery voltage variation pattern. Also, the correction factor may be calculated by inputting a battery temperature into a mathematical model using the battery temperature (T) as an input parameter and the correction factor of the battery open circuit voltage variation as an output parameter.

In order to accomplish the above object, the present invention also provides a method for estimating resistance characteristics of a battery based on a battery voltage variation pattern, which includes obtaining and storing battery voltage, current and temperature data from a voltage sensor, a current sensor and a temperature sensor, which are coupled to a battery, whenever a resistance characteristic is estimated; calculating a battery open circuit voltage from a battery voltage variation pattern measured at the present and in the past; calculating a battery resistance parameter from a battery current and a difference between the battery open circuit voltage and a battery voltage, and calculating a weighted mean resistance from battery resistance parameters calculated at the present and in the past; calculating a weighed mean resistance convergence value by repeatedly calculating a weighted mean sequence using the weighted mean resistance as an initial condition; and estimating a battery resistance from the weighted mean resistance convergence value.

BRIEF DESCRIPTION OF THE DRAWINGS

Other objects and aspects of the present invention will become apparent from the following description of embodiments with reference to the accompanying drawing in which:

FIG. 8 is a table showing an actual resistance, an estimated resistance and an error of the estimated resistance in comparison to the actual resistance for each of twelve batteries selected for experiments.

DESCRIPTION OF THE PREFERRED EMBODIMENT

Hereinafter, preferred embodiments of the present invention will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present invention on the basis of the principle that the inventor is allowed to define terms appropriately for the best explanation. Therefore, the description proposed herein is just a preferable example for the purpose of illustrations only, not intended to limit the scope of the invention, so it should be understood that other equivalents and modifications could be made thereto without departing from the spirit and scope of the invention.

Figure 1:
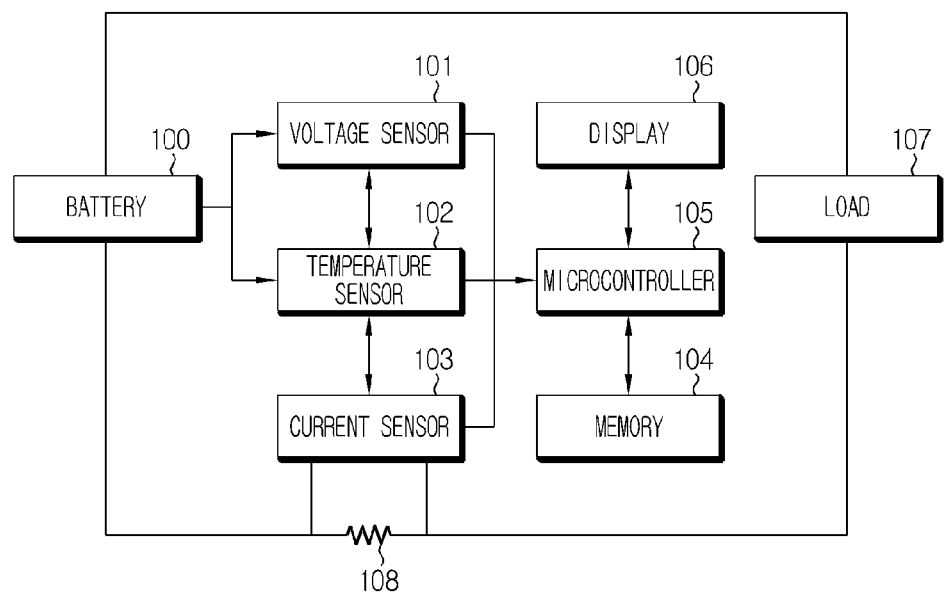
FIG. 1 is a block diagram showing an apparatus for estimating resistance characteristics of a battery based on a battery voltage variation pattern according to an embodiment of the present invention.

FIG. 1 is a schematic view showing an apparatus for estimating resistance characteristics of a battery based on a battery voltage variation pattern according to an embodiment of the present invention.

Referring to FIG. 1, the apparatus for estimating resistance characteristics of a battery based on a battery voltage variation pattern according to the present invention is connected between a battery 100 and a load 107, and includes a voltage sensor 101, a temperature sensor 102, a current sensor 103, a memory 104 and a microcontroller 105.

The voltage sensor 101 measures a battery voltage under the control of the microcontroller 105 at each resistance characteristic estimation and outputs the battery voltage to the microcontroller 105. The measured battery voltage is different from an actual voltage of the battery due to the IR drop effect.

The temperature sensor 102 measures a battery temperature under the control of the microcontroller 105 at each resistance characteristic estimation and outputs the battery temperature to the microcontroller 105.

The current sensor 103 measures a battery current flowing through a current sensing resistance 108 under the control of the microcontroller 105 at each resistance characteristic estimation and outputs the battery current to the microcontroller 105.

The memory 104 stores programs required for estimating resistance characteristics of a battery, various data needed in advance for estimating battery resistance and resistance degradation by using the battery resistance characteristic estimating program, battery voltage, temperature and current data measured by the voltage sensor 101, the temperature sensor 102 and the current sensor 103, and various calculation values occurring while the battery resistance characteristic estimating program estimates battery resistance and resistance degradation.

The microcontroller 105 receives battery voltage, temperature and current data from the voltage sensor 101, the temperature sensor 102 and the current sensor 103 at each estimation of resistance characteristics of the battery 100 and stores the data in the memory 104. Also, the microcontroller 105 reads and executes the battery resistance characteristic estimating program from the memory 104, estimates battery resistance and resistance degradation of a battery and stores the estimated data in the memory 104, and outputs the estimated battery resistance and resistance degradation through a display 106 as necessary.

The kind of the battery 100 is not specially limited, and it may adopt lithium ion batteries, lithium polymer batteries, nickel cadmium batteries, nickel hydrogen batteries, nickel zinc batteries and so on, which are rechargeable and whose charging state should be considered.

The kind of the load 107 is not specially limited, and it may be portable electronic devices such as video cameras, mobile phones, portable PC (Personal Computer), PMP (Portable Multimedia Player) and MP3 players, motors of electric vehicles or hybrid vehicles, DC to DC converters, and so on.

Figure 2:
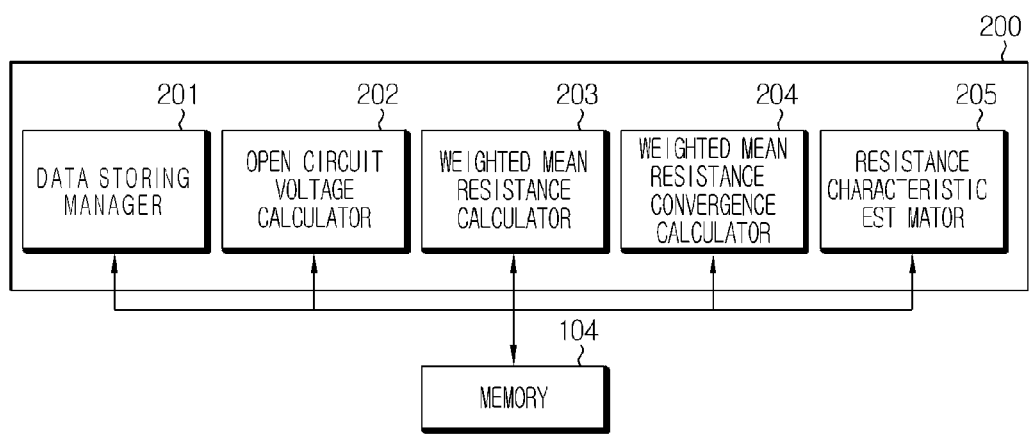
FIG. 2 is a block diagram showing a battery resistance characteristic estimating program according to an embodiment of the present invention.

FIG. 2 is a block diagram showing a battery resistance characteristic estimating program according to an embodiment of the present invention.

Referring to FIG. 2, the battery resistance characteristic estimating program 200 according to the present invention is executed by the microcontroller 105 and includes a data storing manager 201, an open circuit voltage calculator 202, a weighted mean resistance calculator 203, a weighted mean resistance convergence calculator 204 and a resistance characteristic estimator 205.

The data storing manager 201 receives voltage $V^n$, temperature $T^n$ and current $I^n$ of the battery from the voltage sensor 101, the temperature sensor 102 and the current sensor 103, shown in FIG. 1, at each resistance characteristic estimation and stores the data in the memory 104. Here, n is the number of measurement times of voltage, temperature and current, and it is identical to the number of resistance characteristic estimation times.

The open circuit voltage calculator 202 calculates an open circuit voltage variation $\Delta OCV^n$ of a battery using a battery voltage variation pattern, corrects the calculated battery open circuit voltage variation by applying a correction factor according to temperature thereto, and calculates a battery open circuit voltage $OCV^n$ at a present stage by reflecting the corrected battery open circuit voltage variation on a previously calculated open circuit voltage $OCV^{n-1}$. The process of calculating the open circuit voltage variation $\Delta OCV^n$ and the process of correcting the open circuit voltage variation $\Delta OCV^n$ according to temperature will be explained in detail later. The open circuit voltage calculator 202 stores the calculated $\Delta OCV^n$ in the memory 104.

The weighted mean resistance calculator 203 calculates a weighted mean resistance $R_{mean}^n$ using the following Math FIG. 1.

Math FIG. 1

$$R_{mean}^n = (R^{n-1} \times weight + R^n) \div (weight + 1)$$

$$R^{n-1} = |V^{n-1} - OCV^{n-1}| \div |I^{n-1}|$$

$$R^n = |V^{n-1} - OCV^n| \div |I^n|$$

In the Math FIG. 1, $R^n$ and $R^{n-1}$ are battery resistance parameters respectively calculated at $n^{th}$ time and $n-1^{th}$ time, $V^n$ and $V^{n-1}$ are battery voltages respectively measured at $n^{th}$ time and $n-1^{th}$ time, $OCV^n$ and $OCV^{n-1}$ are open circuit voltages of a battery, respectively calculated at $n^{th}$ time and $n-1^{th}$ time, $I^n$ and $I^{n-1}$ are battery currents respectively measured at $n^{th}$ time and $n-1^{th}$ time, n is an integer of 2 or more, and weight is a sufficiently great value, for example 5000 or more.

The weighted mean resistance $R_{mean}^n$ tens to be converged to an actual resistance of a battery as time goes. Hereinafter, this feature is explained in more detail.

Figure 6:
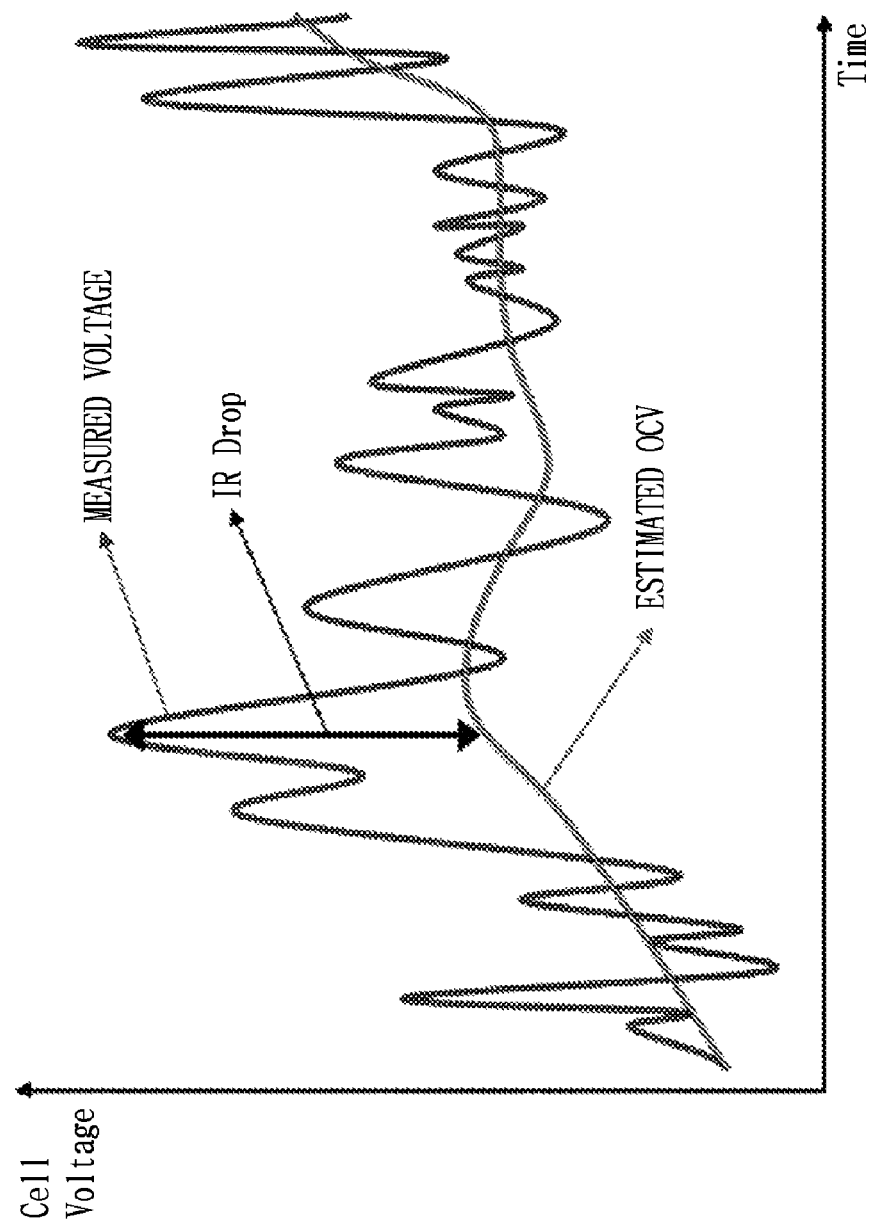
FIG. 6 is a graph showing that a battery voltage directly measured while a charging/discharging test is performed is different from an open circuit voltage estimated according to the present invention due to the IR drop effect.

FIG. 6 is a graph showing $V^n$ periodically measured while charging/discharging a battery in a predetermined pattern and $OCV^n$ periodically estimated using the battery voltage variation pattern.

Referring to FIG. 6, it would be understood that the measured battery voltage $V^n$ is varied more abruptly in comparison to the estimated $OCV^n$. It is caused by the IR drop effect occurring at measuring a battery voltage, so the absolute difference between the measured voltage $V^n$ and the estimated voltage $OCV^n$ is corresponding to a value obtained by multiplying a battery current $I^n$ by a battery resistance $R^n$. Thus, the battery resistance parameter $R^n$ can be considered as representing a resistance characteristic of a battery at the time of measuring $V^n$.

Figure 7:
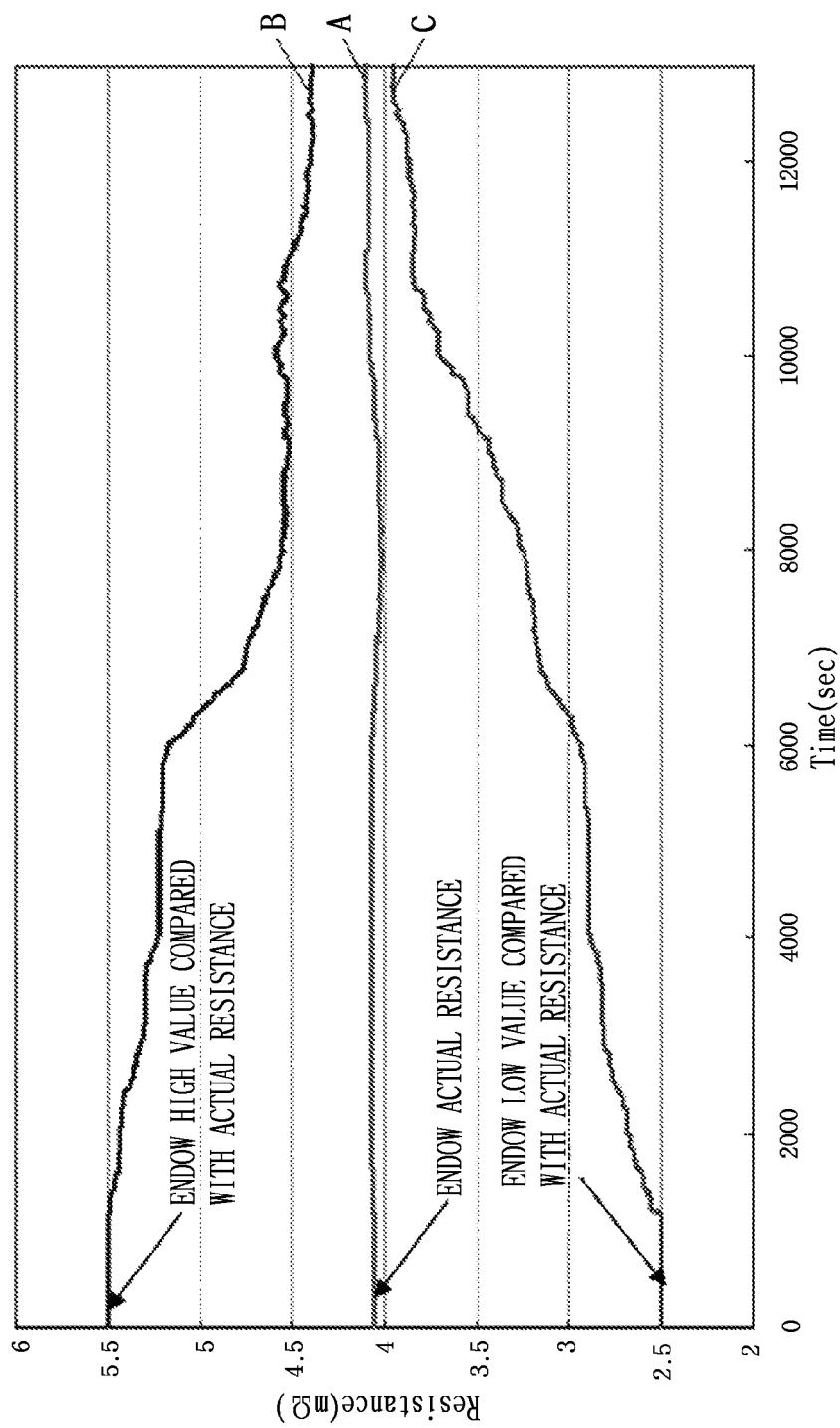
FIG. 7 is a graph showing that a weighted mean value calculated according to the present invention is converged to an actual resistance regardless of initial conditions as time goes.

FIG. 7 is a graph showing a variation pattern of weighted mean resistances $R_{mean}^1$, $R_{mean}^2$, $R_{mean}^3$, $R_{mean}^4$, $R_{mean}^5$ ..., which are periodically calculated according to time passage based on different conditions of the resistance parameter $R^1$, while performing a charging/discharging test to a battery whose resistance is already known.

In FIG. 7, a graph A represents a case that the resistance parameter $R^1$ is set as an actual resistance, a graph B represents a case that the resistance parameter $R^1$ is set higher than an actual resistance, and a graph C represents a case that the resistance parameter $R^1$ is set lower than an actual resistance.

Referring to FIG. 7, though the initial value $R^1$ of the input parameter $R^n$ of the weighted mean resistance is set differently, it would be found that the weighted mean resistance is converged to an actual resistance value as time goes. Thus, a convergence of the weighted mean resistance may be used as a parameter for estimating a battery resistance.

Meanwhile, the convergence of weighted mean resistance can be obtained through a long-term charging/discharging experiment. However, in an actual using environment of a battery, when a weighted mean resistance is obtained at a specific time point, it is impossible which value the weighted mean resistance would be converged to. Thus, in the present invention, when a weighted mean resistance is obtained using resistance parameters $R^{n-1}$ and $R^n$ at a certain time point, a convergence of the weighted mean resistance is estimated using a weighted mean sequence in which the obtained weighted mean resistance is an initial condition.

In more detail, the weighted mean resistance convergence calculator 204 calculates a weighted mean resistance according to a weighted mean sequence using the weighted mean resistance $R_{mean}^n$, calculated by the weighted mean resistance calculator 203, as an initial condition by using the following Math FIG. 2, and this calculation is repeated sufficiently many times. In this way, the weighted mean resistance convergence calculator 204 obtains a convergence $R_{mean}^{\underline{n}}$ of the weighted mean resistance and stores it in the memory 104. Here, $R_{mean}^{\underline{n}}$ means a converged value of $R_{mean}^n$.

Math FIG. 2
Weighted Mean Sequence $$R_{mean}{}^n_{k+1} = (R_{mean}{}^n_{k-1} \times \text{weight} + R_{mean}{}^n_k)/(\text{weight}+1)$$

Initial Condition of Weighted Mean Sequence $$R_{mean}{}^n_1 = (R^{n-1} \times \text{weight} + R^n) \div (\text{weight}+1)$$

In the Math FIG. 2, k is an integer of 1 or more. The weighted mean sequence is calculated as much as a large number over several thousands. An initial convergence $R_{mean}{}_1$ of the weighted mean resistance may refer to a value that is set at the time of production of the battery and stored in the memory 104.

The weighted mean resistance $R_{mean}{}^n$ tends to be converged to an actual resistance value without depending on an initial condition $R^1$ of the resistance parameter, as shown in FIG. 7. Thus, in the weighted mean sequence according to the Math FIG. 2, an initial value $R_{mean}{}^n_0$ when k=1 may be set arbitrarily, but depending on the magnitude of $R_{mean}{}^n_0$, the number of calculations is excessively increased until the weighted mean resistance is converged to a certain value. Thus, the initial value $R_{mean}{}^n_0$ is preferably set as a convergence value $R_{mean}{}^{n-1}$ obtained in a previous stage or an n battery resistance value when the battery was produced. In this case, the number of sequence calculations may be reduced until the weighted mean resistance is converged to an actual resistance value, so the weighted mean resistance may be rapidly converged to an actual resistance value.

The resistance characteristic estimator 205 reads the weighted mean resistance convergence value $R_{mean}{}^n$ from the memory 104, and then the resistance characteristic estimator 205 estimates a battery resistance $\tilde{R}^n$ and then stores it in the memory 104. Here, $\tilde{R}^n$ means a battery resistance estimated at an $n^{th}$ resistance estimating.

For example, the resistance characteristic estimator 205 may estimate the weighted mean resistance convergence value $R_{mean}{}^n$ into the battery resistance $\tilde{R}^n$ as it is.

As another example, the resistance characteristic estimator 205 may estimate a battery resistance $\tilde{R}^n$ corresponding to the weighted mean resistance convergence value $R_{mean}{}^n$ using correlation between the weighted mean resistance convergence value and the battery resistance.

This correlation may be a look-up table defining battery resistance for each weighted mean resistance convergence value. As an alternative, the correlation may be a function using a weighted mean resistance convergence value and a battery resistance as an input parameter and an output parameter, respectively.

The correlation is obtained through charging/discharging tests for a battery. In other words, while charging/discharging experiments are conducted under the same conditions for a long time to a sufficiently large amount of batteries whose actual resistance are already known in a wide range, weighted mean resistance convergence values are obtained. After that, battery resistances corresponding to the weighted mean resistance convergence values obtained through the experiments are configured into a look-up table. In other case, a functional relation between weighted mean resistance convergence values and battery resistances may be obtained through a numerical analysis using the weighted mean resistance convergence values obtained through the experiments and the battery resistances as input parameters and output parameters, respectively.

As still another alternative, the resistance characteristic estimator 205 may estimate a battery resistance $\tilde{R}^n$ by relatively comparing the weighted mean resistance convergence value $R_{mean}{}^n$ calculated by the weighted mean resistance convergence calculator 204 with the weighted mean resistance convergence value corresponding to an initial resistance value when the battery was produced, stored in the memory 104.

Figure 3:
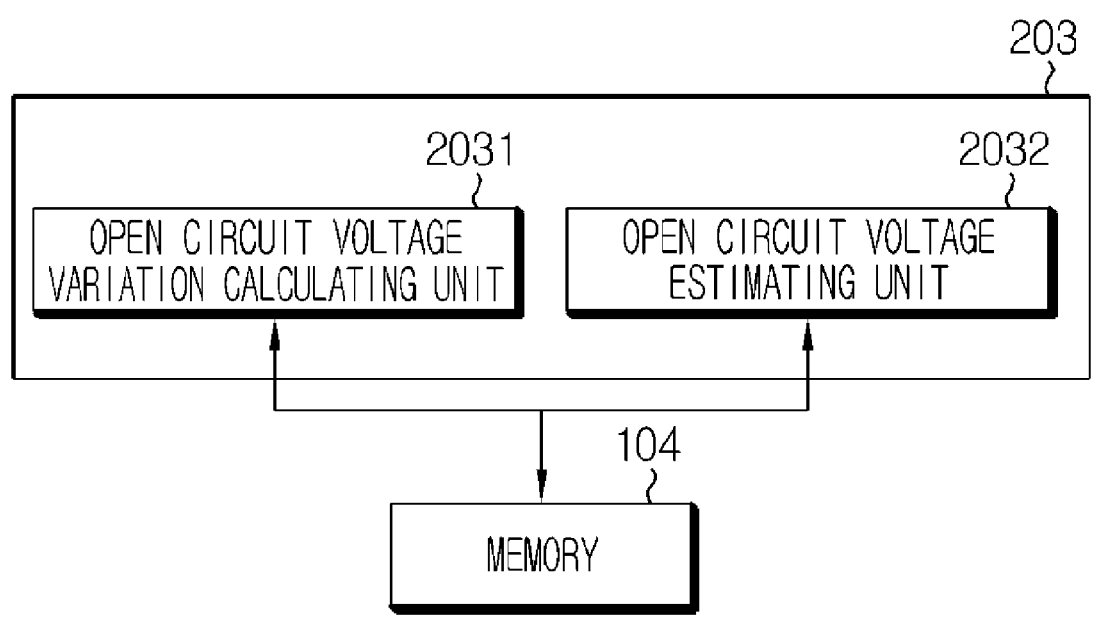
FIG. 3 is a block diagram showing an open circuit voltage calculator for estimating an open circuit voltage using a battery voltage variation pattern according to the present invention.

The resistance characteristic estimator 205 may calculate a relative ratio of the estimated battery resistance $\tilde{R}^n$ to an initial battery resistance value $R^{initial}$ according to the following Math FIG. 3 after estimating a battery resistance $\tilde{R}^n$, and then store the calculated result in the memory 104 as $SOH_R{}^n$ that is a parameter representing resistance degradation of the battery.

Math FIG. 3

$$SOH_R{}^n = [(R^{limit} - \tilde{R}^n) \div (R^{limit} - R^{initial})] \times 100$$

In the Math FIG. 3, $SOH_R{}^n$: resistance degradation of a battery, obtained at an $n^{th}$ estimation, $\tilde{R}^n$: a battery resistance, obtained at an $n^{th}$ estimation, $R^{initial}$: an initial battery resistance value when the battery was produced, and $R^{limit}$: an allowable maximum resistance available for a battery.

$SOH_R{}^n$ represents a present battery resistance as a relative ratio to an initial battery resistance value. The battery resistance tends to increasing as time goes, so $SOH_R{}^n$ becomes a parameter to determine how much battery life remains after the battery was initially used. Also, $SOH_R{}^n$ may be utilized to control a charging/discharging capacity of a battery. For example, if $SOH_R{}^n$ is decreased, a charging capacity and a discharging capacity of a battery may be decreased accordingly. In this case, it is possible to effectively prevent a battery from being overcharged or overdischarged by charging or discharging the battery suitably for its resistance.

The resistance characteristic estimator 205 may output the estimated $SOH_R{}^n$ to the display 106. In this case, the display 106 is coupled to the microcontroller 105 through an interface. Also, the resistance characteristic estimator 205 outputs $SOH_R{}^n$ to the display 106 through the interface. Then, the display 106 visually displays $SOH_R{}^n$ such that a user may recognize it. $SOH_R{}^n$ may be displayed as texts directly or as graphs.

FIG. 3 is a block diagram showing an open circuit voltage calculator 202 for estimating a battery open circuit voltage using a battery voltage variation pattern according to the present invention in more detail.

Referring to FIG. 3, the open circuit voltage calculator 203 includes an open circuit voltage variation calculating unit 2031 and an open circuit voltage estimating unit 2032.

The open circuit voltage variation calculating unit 2031 calculates an open circuit voltage variation based on an open circuit voltage at a last stage using a battery voltage variation pattern in order to calculate a present battery open circuit voltage. In other words, the open circuit voltage variation calculating unit 2031 calculates how much a battery open circuit voltage at a present stage is changed based on the open circuit voltage at a last stage.

In detail, the open circuit voltage variation calculating unit 2031 reads a battery voltage $V^n$ measured at a present resistance characteristic estimation, a battery voltage $V^{n-1}$ measured at a last resistance characteristic estimation and a battery temperature $T^n$ measured at a present resistance characteristic estimation from the memory 104. After that, the open circuit voltage variation calculating unit 2031 calculates an open circuit voltage variation $\Delta OCV^n$ according to the following Math FIG. 4.

Figure 4:
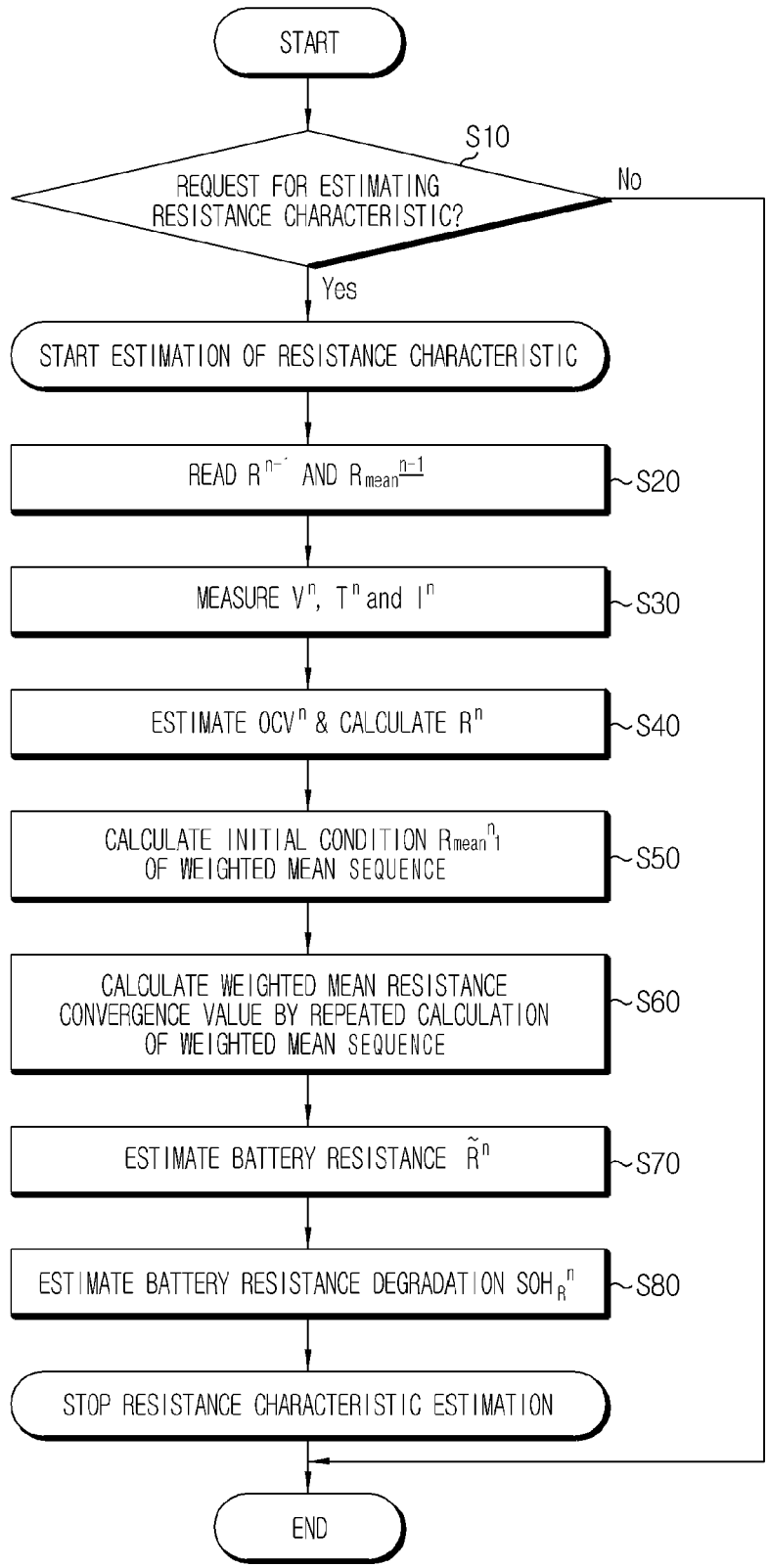
FIG. 4 is a flowchart illustrating a method for estimating resistance characteristics of a battery using a battery voltage variation according to an embodiment of the present invention.

Math FIG. 4

$$\Delta OCV^n = OCV^n - OCV^{n-1} = G(V) \times F(T)$$

In the Math FIG. 4, G(V) is an open circuit voltage variation operation function for mapping a battery voltage variation '$V^n - V^{n-1}$', into an open circuit voltage variation $\Delta OCV^n$, and F(T) is an open circuit voltage correction function for correcting the open circuit voltage variation $\Delta OCV^n$ by reflecting an open circuit voltage change according to temperature.

G(V) is a function not for converting a battery voltage variation into an open circuit voltage variation as it is, but for converting the battery voltage variation into the open circuit voltage variation by correcting an error of battery voltage caused by IR drop (namely, a difference between a measured voltage and an actual voltage). In other words, if a battery voltage variation tends to increase, G(V) decreases the battery voltage variation and then outputs the decreased battery voltage variation as a battery open circuit voltage variation. Also, if a battery voltage variation tends to be kept as it was, G(V) outputs the battery voltage variation as a battery open circuit voltage variation as it is. In addition, if a battery voltage variation tends to decrease, G(V) amplifies the battery voltage variation slightly and then outputs the slightly amplified battery voltage variation as a battery open circuit voltage variation.

G(V) may be obtained by mathematically modeling a correlation between a battery voltage variation pattern and an open circuit voltage variation corresponding thereto under a certain temperature condition. As one example, the mathematical modeling function may be obtained by analyzing a correlation existing between a variation pattern of battery voltages $V^n$, $V^{n-1}$ and $V^{n-2}$ and an open circuit voltage variation $\Delta OCV^n$ corresponding thereto under a laboratory condition allowing measurement of battery voltage and battery open circuit voltage. The number of battery voltages configuring a variation pattern of battery voltages may be extended to four or more.

G(V) may be generalized as in the following Math FIG. 5.

Figure 5:
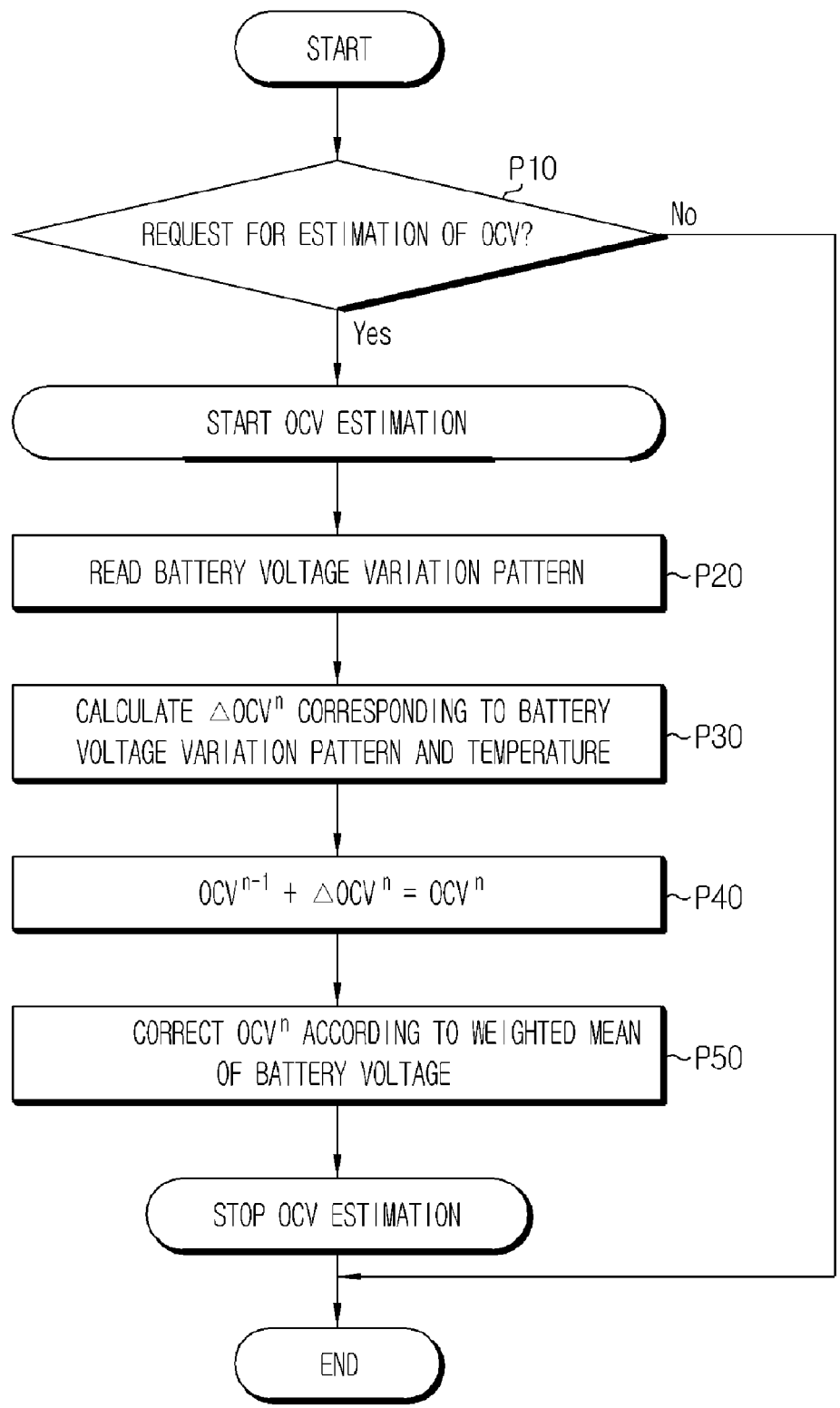
FIG. 5 is a flowchart illustrating a method for estimating an open circuit voltage using a battery voltage variation according to an embodiment of the present invention.

Math FIG. 5

$$G(V) = (V^n - V^{n-1}) \times g(V^n, V^{n-1}, V^{n-2} \ldots)$$

Here, $g(V^n, V^{n-1}, V^{n-2} \ldots)$ is a pattern function defining a variation pattern of battery voltages measured at each resistance characteristic estimation. The symbol '...' means that the pattern function may be defined using at least three battery voltages, including a battery voltage measured at a present stage. The pattern function is defined by analyzing a correlation between a plurality of battery voltage variations and battery open circuit voltage variations, experimentally obtained. As an example, the function g may be defined as a relative ratio of a voltage variation at a last stage to a voltage variation at a present stage. However, the present invention is not limited to any specific math figure of the pattern function g.

Meanwhile, a battery resistance changes depending on temperature. If a resistance of a battery is changed, a battery voltage variation pattern and a battery open circuit voltage variation are changed even under the same charging or discharging condition. F(T) corrects the open circuit voltage variation, calculated by G(V), according to a temperature condition. In other words, F(T) is a function for correcting an open circuit voltage variation calculated by G(V) in case a battery temperature is different from a standard temperature set as a calculation condition of G(V). F(T) may be obtained by analyzing a correlation between a battery voltage variation pattern and a battery open circuit voltage variation while changing temperature at regular intervals. In other words, under the experimental conditions that a battery voltage variation pattern at each measurement temperature set as regular intervals, for example 1° C. intervals, is identical, F(T) may be obtained by measuring a changing amount of a battery open circuit voltage variation $\Delta OCV^n$ in comparison to $\Delta OCV^n$ obtained at a standard temperature and then applying a mathematical modeling for the temperature and the changing amount of $\Delta OCV^n$ by using the temperature T and the changing amount $\Delta OCV^n$ as an input parameter and an output parameter, respectively. The obtained F(T) becomes a function outputting a correction factor of a battery open circuit voltage variation using the battery temperature T as an input parameter. For simplified calculation, it is possible to configure a look-up table with correction factors depending on each T value and stores the look-up table in the memory 104 such that a correction factor for each temperature, stored in the look-up table, may be referred to for obtaining a correction factor used to correct a battery open circuit voltage variation.

The open circuit voltage estimating unit 2032 reads an open circuit voltage $OCV^{n-1}$ calculated at a last resistance characteristic estimation from the memory 104, and then adds the open circuit voltage variation $\Delta OCV^n$ calculated by the open circuit voltage variation calculating unit 2031 to $OCV^{n-1}$ to calculate an open circuit voltage $OCV^n$ and stores it in the memory 104.

Preferably, the open circuit voltage estimating unit 2032 calculates a weighted mean value $V^n_{(meanvalue)}$ between a battery voltage $V_n$ and a battery voltage measured at a previous stage through the following Math FIG. 6.

Math FIG. 6

$$V^n_{(meanvalue)} = (A_1 * V_1 + A_2 * V_2 + \ldots + A_{n-1} * V_{n-1} + A_n * V_n) / A_{total}$$

$$A_{total} = A_1 + A_2 + A_3 + \ldots + A_n$$

In Math FIG. 6, $A_k$ is decreased as k increases. For example, in case n=100, $A_k$ may have a value starting from 100 and decreased by 1. As an alternative example, in the Math FIG. 6, $A_1 * V_1 + A_2 * V_2 + \ldots + A_{k-2} * V_{k-2} (3 \leq k \leq n)$ may be omitted. Even in this case, the changing tendency of $A_k$ is maintained as above. For example, in case k=n, it is possible that $A_1 * V_1 + A_2 * V_2 + \ldots + A_{n-2} * V_{n-2}$ is set as 0 and a larger value is endowed to $A_{n-1}$ rather than $A_n$. For example, 90 and 10 may be endowed to $A_{n-1}$ and $A_n$, respectively.

The open circuit voltage estimating unit 2032 may correct the open circuit voltage once again by adding a difference between the calculated weighted mean value $V^n_{(meanvalue)}$ and the open circuit voltage $OCV^{n-1}$ to the calculated open circuit voltage $OCV^n$ for additional correction. If the weighted mean value $V^n_{(meanvalue)}$ is calculated and used for correcting an open circuit voltage additionally, a calculation error of the open circuit voltage may be decreased though a voltage output from the battery 100 is abnormally changed. If the open circuit voltage is completely corrected using the weighted mean value $V^n_{(meanvalue)}$, the open circuit voltage estimating unit 2032 stores the corrected open circuit voltage $OCV^n$ in the memory 104.

It is apparent that the open circuit voltage $OCV^n$ stored in the memory 104 by the open circuit voltage estimating unit 2032 is referred to when calculating an input parameter $R^n$ of the weighted mean resistance.

Now, a method for estimating battery resistance characteristics using a battery voltage variation pattern will be explained in detail based on the above.

FIG. 4 is a flowchart illustrating a method for estimating battery resistance characteristics based on a battery voltage variation pattern according to the present invention. In FIG. 4, each step is executed by the microcontroller 105 shown in FIG. 1.

In the step S10, it is determined whether there is a request for resistance characteristic estimation of a battery. The resistance characteristic estimation request may be input from the outside or automatically generated by a battery resistance characteristic estimating program.

If there is a battery resistance characteristic estimation request as a determination result of the S10, a routine for estimating battery resistance characteristics is initiated. On the contrary, if there is no battery resistance characteristic estimation request, the process is terminated.

In the step S20, a battery resistance parameter $R^{n-1}$ and a weighted mean resistance convergence value $R_{mean}^{n-1}$, obtained at a last resistance characteristic estimation are read from the memory. Subsequently, in the step S30, $V^n$, $T^n$ and $I^n$ are measured using the voltage sensor, the temperature sensor and the current sensor.

Then, in the step S40, a battery open circuit voltage $OCV^n$ is estimated by means of a battery voltage variation pattern, and a battery resistance parameter $R^n$ is calculated from $V^n$, $I^n$ and $OCV^n$.

Then, in the step S50, an initial condition $R_{mean}{}^n{}_1$ of the weighted mean sequence is obtained from $R^{n-1}$ and $R^n$. The Math FIG. 2 is used when calculating $R_{mean}{}^n{}_1$.

After that, in the step S60, the weighted mean sequence is repeatedly calculated as much as a sufficient number using the initial conditions $R_{mean}{}^n{}_1$ and $R_{mean}^{n-1}$ to calculate a convergence value $R_{mean}^n$ of the weighted mean resistance. The Math FIG. 2 is used when calculating $R_{mean}^n$. $R_{mean}^{n-1}$ may be substituted with a preset $R_{mean}^1$. Here, $R_{mean}^1$ may be set with an initial battery resistance value when the battery was initially produced.

After that, in the step S70, a battery resistance $\tilde{R}^n$ is estimated from the convergence value $R_{mean}^n$ of the weighted mean resistance. As one example, the battery resistance $\tilde{R}^n$ may be estimated to be identical to the convergence value $R_{mean}^n$ of the weighted mean resistance. As another example, a battery resistance $\tilde{R}^n$ corresponding to the convergence value $R_{mean}^n$ of the weighted mean resistance may be estimated using the correlation between the convergence value of the weighted mean resistance and the battery resistance. The correlation may be a look-up table defining battery resistance for each convergence value of the weighted mean resistance or a function using the convergence value of the weighted mean resistance and the battery resistance as an input parameter and an output parameter, respectively. As still another example, a battery resistance may be estimated based on an initial battery resistance value by relatively comparing the convergence value of the weighted mean resistance corresponding to the initial battery resistance value with the weighted mean convergence value $R_{mean}^n$ calculated in the step S60. In other words, the initial battery resistance value is increased as much as an increment ratio of the weighted mean convergence value, and the increased value may be estimated as a battery resistance.

And then, in the step S80, a relatively increment of the estimated battery resistance $\tilde{R}^n$ is calculated based on the initial battery resistance value $R^{initial}$, and $SOH_R{}^n$ is estimated by means of the calculated relative increment ratio. The estimated $SOH_R{}^n$ is stored in the memory 104 or output to the display 106. At this time, the relative increment ratio is preferably calculated based on an allowable maximum resistance $R^{limit}$ according to the Math FIG. 3.

If the above processes are completed, the procedure for estimating resistance characteristics of a battery is entirely completed.

FIG. 5 is a flowchart illustrating a process for estimating an open circuit voltage $OCV^n$ based on a battery voltage variation pattern in the step S40 of FIG. 4. In FIG. 5, each step is executed by the microcontroller 105 shown in FIG. 1.

Referring to FIG. 5, first, in the step P10, it is determined whether there is a request for estimation of an open circuit voltage $OCV^n$. The request for estimation may be input from the outside or automatically generated according to a program algorithm.

If there is a request for estimation of $OCV^n$ in the step P10, an open circuit voltage estimating step is executed. If there is no request for estimation of $OCV^n$, the process is terminated.

In the step P20, a battery voltage variation pattern stored in the memory is read. The battery voltage variation pattern includes at least $V^n$, $V^{n-1}$ and $V^{n-2}$. After that, in the step P30, an open circuit voltage variation $\Delta OCV^n$ is calculated by means of the battery voltage variation pattern and a battery temperature. Here, the calculation method for an open circuit voltage variation $\Delta OCV^n$ is already explained above.

Meanwhile, in the present invention, $V^1$ and $V^2$ as well as $OCV^1$ and $OCV^2$ are initialized into battery voltages in an unloaded state, measured right before a battery is connected to a load. For example, in case a battery is used for an electric-driven vehicle, $V^1$ and $V^2$ as well as $OCV^1$ and $OCV^2$ are set as battery voltages measured when the vehicle starts using a key.

Then, in the step P40, the open circuit voltage variation $\Delta OCV^n$ is added to a last open circuit voltage $OCV^{n-1}$ to calculate a present open circuit voltage $OCV^n$.

Subsequently, in the step P50 that may be selectively executed, a weighted mean value of a present battery voltage $V^n$ and a last battery voltage $V^{n-1}$ is calculated, and a difference between the calculated weighted mean value and the last open circuit voltage $OCV^{n-1}$ is added to the present open circuit voltage $OCV^n$ to additionally correct the open circuit voltage $OCV^n$. The calculation method for weight mean value is already explained above.

Finally, in the step P60, the estimated open circuit voltage $OCV^n$ is stored in the memory 104.

Experimental Example

Hereinafter, effects of the present invention will be explained based on the following experimental example. However, the following experimental example is just for illustrating the present invention, not intended to limit the scope of the invention.

For this experiment, 12 batteries whose actual resistances are already known were prepared. Among 12 batteries, a fifth battery had an initial resistance value when the battery was produced. After that, each battery was charged/discharged for a sufficient time under the same charging/discharging conditions. If 1 hour passes, a weighted mean resistance convergence value was obtained according to the present invention, and then the convergence value of weighted mean resistance was estimated as a battery resistance.

FIG. 8 is a table showing an actual resistance, an estimated resistance and an error of the estimated resistance in comparison to the actual resistance for each of twelve batteries selected for experiments.

Referring to FIG. 8, the battery resistance estimated according to the present invention is within the range of 3% in comparison to an actual resistance. Thus, the present invention ensures estimation of battery resistance with high accuracy, and also enables to accurately estimate battery resistance degradation that is a parameter capable of being calculated from the battery resistance.

APPLICABILITY TO THE INDUSTRY

According to the present invention, battery resistance characteristics may be accurately estimated by simple sequence calculation. Also, the accurately estimated battery resistance may be applied in various ways, for example to estimate a time for exchange of a battery. Further, since a battery charging/discharging capacity may be controlled based on the accurately estimated resistance degradation, the present invention may prevent overcharging or overdischarging, thereby improving safety of a battery.

The present invention has been described in detail. However, it should be understood that the detailed description and specific examples, while indicating preferred embodiments of the invention, are given by way of illustration only, since various changes and modifications within the spirit and scope of the invention will become apparent to those skilled in the art from this detailed description.

What is claimed is:

1. An apparatus for estimating resistance characteristics of a battery based on a battery voltage variation pattern, comprising:
    an open circuit voltage calculator for calculating a battery open circuit voltage from a battery voltage variation pattern measured at the present and in the past;
    a weighted mean resistance calculator for calculating a battery resistance parameter from a battery current and a difference between the battery open circuit voltage and a battery voltage, and calculating a weighted mean resistance from battery resistance parameters calculated at the present and in the past;
    a weighted mean resistance convergence calculator for calculating a weighed mean resistance convergence value by repeatedly calculating a weighted mean sequence; and
    a resistance characteristic estimator for estimating a battery resistance from the weighted mean resistance convergence value.

2. The apparatus for estimating resistance characteristics of a battery based on a battery voltage variation pattern according to claim 1, wherein the open circuit voltage calculator includes:
    an open circuit voltage variation calculating unit for calculating an open circuit voltage variation from a variation pattern of the stored battery voltages measured at the present and in the past by applying a mathematic model defining a correlation between a battery voltage variation pattern and an open circuit voltage variation, and estimating an open circuit voltage variation at a present stage by reflecting a correction factor corresponding to battery temperature on the calculated open circuit voltage variation; and
    an open circuit voltage estimating unit for estimating a battery open circuit voltage at the present stage by reflecting the estimated open circuit voltage variation to a battery open circuit voltage estimated at a last stage.

3. The apparatus for estimating resistance characteristics of a battery based on a battery voltage variation pattern according to claim 2,
    wherein the open circuit voltage estimating unit corrects an open circuit voltage by adding a difference between a weight mean value (a greater weight is endowed as battery voltage is measured earlier) for present and previous battery voltages and an open-circuit voltage at a last stage to the estimated open-circuit voltage at a present stage.

4. The apparatus for estimating resistance characteristics of a battery based on a battery voltage variation pattern according to claim 3,
    wherein the previous battery voltage is a battery voltage at a last stage.

5. The apparatus for estimating resistance characteristics of a battery based on a battery voltage variation pattern according to claim 2,
    wherein the estimated open circuit voltage variation is calculated by multiplying the calculated open circuit voltage variation by the correction factor corresponding to temperature.

6. The apparatus for estimating resistance characteristics of a battery based on a battery voltage variation pattern according to claim 2,
    wherein the battery voltage variation pattern includes at least the battery voltages $V_n$, $V_{n-1}$ and $V_{n-2}$ measured at a present stage, at a last stage and at the stage before last.

7. The apparatus for estimating resistance characteristics of a battery based on a battery voltage variation pattern according to claim 2,
    wherein the mathematical model is defined by a mathematical operation between a battery voltage variation between a present stage and a previous stage and a pattern function defined by each voltage of the battery voltage variation pattern.

8. The apparatus for estimating resistance characteristics of a battery based on a battery voltage variation pattern according to claim 2,
    wherein the correction factor is calculated by inputting a battery temperature into a mathematical model using the battery temperature (T) as an input parameter and the correction factor of the battery open circuit voltage variation as an output parameter.

9. The apparatus for estimating resistance characteristics of a battery based on a battery voltage variation pattern according to claim 1,
    wherein the resistance characteristic estimator estimates the weighted mean resistance convergence value as a battery resistance.

10. The apparatus for estimating resistance characteristics of a battery based on a battery voltage variation pattern according to claim 1,
    wherein the resistance characteristic estimator estimates a battery resistance by mapping a battery resistance corresponding to the calculated weighted mean resistance convergence value from a look-up table defining a battery resistance for each weighted mean resistance convergence value.

11. The apparatus for estimating resistance characteristics of a battery based on a battery voltage variation pattern according to claim 1,
    wherein the resistance characteristic estimator estimates a battery resistance by inputting the calculated weighted mean resistance convergence value to a function using the weighted mean resistance convergence value and the battery resistance as an input parameter and an output parameter, respectively.

12. The apparatus for estimating resistance characteristics of a battery based on a battery voltage variation pattern according to claim 1,
    wherein the resistance characteristic estimator estimates a battery resistance by relatively comparing the calculated weighted mean resistance convergence value with a weighted mean resistance convergence value corresponding to an initial battery resistance value when a battery was produced.

13. The apparatus for estimating resistance characteristics of a battery based on a battery voltage variation pattern according to claim 1, wherein the weighted mean resistance calculator calculates a weighted mean resistance ($R_{mean}^n$) according to the following Math Figure:

$$R_{mean}^n = (R^{n-1} \times weight + R^n) \div (weight+1)$$

$$R^{n-1} = |V^{n-1} - OCV^{n-1}| \div |I^{n-1}|$$

$$R^n = |V^n - OCV^n| \div |I^n|$$

where $R^n$ and $R^{n-1}$ are battery resistance parameters respectively calculated at $n^{th}$ time and $n-1^{th}$ time, where $V^n$ and $V^{n-1}$ are battery voltages respectively measured at $n^{th}$ time and $n-1^{th}$ time, where $OCV^n$ and $OCV^{n-1}$ are open circuit voltages of a battery, respectively calculated at $n^{th}$ time and $n-1^{th}$ time, and where $I^n$ and $I^{n-1}$ are battery currents respectively measured at $n^{th}$ time and $n-1^{th}$ time.

14. The apparatus for estimating resistance characteristics of a battery based on a battery voltage variation pattern according to claim 1, wherein the weighted mean resistance convergence calculator calculates a weighted mean resistance convergence value ($R_{mean}^n$) according to the following weighted mean sequence (k is 1 or more):

$$R_{mean\,k+1}^n = (R_{mean\,k-1}^n \times weight + R_{mean\,k}^n)/(weight+1),$$

wherein an initial condition ($R_{mean\,1}^n$) of the weighted mean sequence is set by the following condition:

$$R_{mean\,1}^n = (R^{n-1} \times weight + R^n) \div (weight+1),$$

wherein $R_{mean\,0}^n$ is set as a weighted mean resistance convergence value at a last stage or an initial battery resistance value.

15. The apparatus for estimating resistance characteristics of a battery based on a battery voltage variation pattern according to claim 1, wherein the resistance characteristic estimator estimates a relative ratio of the estimated battery resistance to an initial battery resistance value based on an allowable maximum resistance as a parameter representing battery resistance degradation.

16. A system implementing an estimation of resistance characteristics of a battery based on a battery voltage variation pattern, comprising:

a battery;

a load receiving a power from the battery; and the apparatus according to the claim 1, wherein the apparatus is connected between the battery and the load.

17. A method for estimating resistance characteristics of a battery based on a battery voltage variation pattern, comprising:

(a) calculating a battery open circuit voltage from a battery voltage variation pattern measured at the present and in the past;

(b) calculating a battery resistance parameter from a battery current and a difference between the battery open circuit voltage and a battery voltage, and calculating a weighted mean resistance from battery resistance parameters calculated at the present and in the past;

(c) calculating a weighed mean resistance convergence value by repeatedly calculating a weighted mean sequence; and (d) estimating a battery resistance from the weighted mean resistance convergence value.

18. The method for estimating resistance characteristics of a battery based on a battery voltage variation pattern according to claim 17, wherein the step (a) includes:

calculating an open circuit voltage variation from a variation pattern of the stored battery voltages measured at the present and in the past by applying a mathematic model defining a correlation between a battery voltage variation pattern and an open circuit voltage variation, and estimating an open circuit voltage variation at a present stage by reflecting a correction factor corresponding to battery temperature on the calculated open circuit voltage variation; and estimating a battery open circuit voltage at the present stage by reflecting the estimated open circuit voltage variation to a battery open circuit voltage estimated at a last stage.

19. The method for estimating resistance characteristics of a battery based on a battery voltage variation pattern according to claim 18, further comprising:

correcting an open circuit voltage by adding a difference between a weight mean value (a greater weight is endowed as battery voltage is measured earlier) for present and previous battery voltages and an open-circuit voltage at a last stage to the estimated open-circuit voltage at a present stage.

20. The method for estimating resistance characteristics of a battery based on a battery voltage variation pattern according to claim 19, wherein the previous battery voltage is a battery voltage at a last stage.

21. The method for estimating resistance characteristics of a battery based on a battery voltage variation pattern according to claim 18, wherein the estimated open circuit voltage variation is calculated by multiplying the calculated open circuit voltage variation by the correction factor corresponding to temperature.

22. The method for estimating resistance characteristics of a battery based on a battery voltage variation pattern according to claim 18, wherein the battery voltage variation pattern includes at least voltages $V_n$, $V_{n-1}$ and $V_{n-2}$ measured at a present stage, at a last stage and at the stage before last.

23. The method for estimating resistance characteristics of a battery based on a battery voltage variation pattern according to claim 18, wherein the mathematical model is defined by a mathematical operation between a battery voltage variation between a present stage and a previous stage and a pattern function defined by each voltage of the battery voltage variation pattern.

24. The method for estimating resistance characteristics of a battery based on a battery voltage variation pattern according to claim 18, wherein the correction factor is calculated by inputting a battery temperature into a mathematical model using the battery temperature (T) as an input parameter and the correction factor of the battery open circuit voltage variation as an output parameter.

25. The method for estimating resistance characteristics of a battery based on a battery voltage variation pattern according to claim 17, wherein, in the step (d), the weighted mean resistance convergence value is estimated as a battery resistance.

26. The method for estimating resistance characteristics of a battery based on a battery voltage variation pattern according to claim 17, wherein, in the step (d), a battery resistance is estimated by mapping a battery resistance corresponding to the calculated weighted mean resistance convergence value from a look-up table defining a battery resistance for each weighted mean resistance convergence value.

27. The method for estimating resistance characteristics of a battery based on a battery voltage variation pattern according to claim 17,
wherein, in the step (d), a battery resistance is estimated by inputting the calculated weighted mean resistance convergence value to a function using the weighted mean resistance convergence value and the battery resistance as an input parameter and an output parameter, respectively.

28. The method for estimating resistance characteristics of a battery based on a battery voltage variation pattern according to claim 17,
wherein, in the step (d), a battery resistance is estimated by relatively comparing the calculated weighted mean resistance convergence value with a weighted mean resistance convergence value corresponding to an initial battery resistance value when a battery was produced.

29. The method for estimating resistance characteristics of a battery based on a battery voltage variation pattern according to claim 17, wherein, in the step (b), a weighted mean resistance ($R_{mean}^n$) is calculated according to the following Math Figure:

$$R_{mean}^n = (R^{n-1} \times \text{weight} + R^n) \div (\text{weight}+1)$$

$$R^{n-1} = |V^{n-1} - OCV^{n-1}| \div |I^{n-1}|$$

$$R^n = |V^n - OCV^n| \div |I^n|$$

where $R^n$ and $R^{n-1}$ are battery resistance parameters respectively calculated at $n^{th}$ time and $n-1^{th}$ time,
where $V^n$ and $V^{n-1}$ are battery voltages respectively measured at $n^{th}$ time and $n-1^{th}$ time,
where $OCV^n$ and $OCV^{n-1}$ are open circuit voltages of a battery, respectively calculated at $n^{th}$ time and $n-1^{th}$ time, and
where $I^n$ and $I^{n-1}$ are battery currents respectively measured at $n^{th}$ time and $n-1^{th}$ time.

30. The method for estimating resistance characteristics of a battery based on a battery voltage variation pattern according to claim 17,
wherein, in the step (c), a weighted mean resistance convergence value ($R_{mean}^n$) calculated according to the following weighted mean sequence (k is 1 or more):

$$R_{mean\ k+1}^n = (R_{mean\ k-1}^n \times \text{weight} + R_{mean\ k}^n)/(\text{weight}+1),$$

wherein an initial condition ($R_{mean\ 1}^n$) of the weighted mean sequence is set by the following condition:

$$R_{mean\ 1}^n = (R^{n-1} \times \text{weight} + R^n) \div (\text{weight}+1),$$

wherein $R_{mean\ 0}^n$ is set as a weighted mean resistance convergence value at a last stage or an initial battery resistance value.

31. The method for estimating resistance characteristics of a battery based on a battery voltage variation pattern according to claim 17, further comprising:
estimating a relative ratio of the estimated battery resistance to an initial battery resistance value based on an allowable maximum resistance as a parameter representing battery resistance degradation.

* * * * *